United States Patent
Chen

(10) Patent No.: US 12,232,251 B2
(45) Date of Patent: Feb. 18, 2025

(54) ILLUMINATED KEYBOARD AND BACKLIGHT MODULE THEREOF

(71) Applicant: Chicony Electronics Co., Ltd., New Taipei (TW)

(72) Inventor: Chia-Hsin Chen, New Taipei (TW)

(73) Assignee: CHICONY ELECTRONICS CO., LTD., New Taipei (TW)

(*) Notice: Subject to any disclaimer, the term of this patent is extended or adjusted under 35 U.S.C. 154(b) by 100 days.

(21) Appl. No.: 17/990,985

(22) Filed: Nov. 21, 2022

(65) Prior Publication Data

US 2023/0380054 A1    Nov. 23, 2023

(30) Foreign Application Priority Data

May 19, 2022   (TW) .................................. 111118768

(51) Int. Cl.
*H05K 1/02*      (2006.01)
*H01H 13/82*     (2006.01)

(52) U.S. Cl.
CPC ........... *H05K 1/0271* (2013.01); *H01H 13/82* (2013.01); *H01H 2219/04* (2013.01); *H05K 2201/10053* (2013.01); *H05K 2201/10106* (2013.01); *H05K 2201/10113* (2013.01)

(58) Field of Classification Search
CPC ....... H05K 1/0271; H05K 2201/10053; H05K 2201/10106; H05K 2201/10113; H05K 1/181; H05K 1/111; H05K 2201/09063; H05K 1/02; H01H 13/83; H01H 2219/04
See application file for complete search history.

(56) References Cited

U.S. PATENT DOCUMENTS

2014/0190804 A1* 7/2014 Zhang ..................... H01H 13/83
                                                              200/314

* cited by examiner

*Primary Examiner* — Lheiren Mae A Caroc
(74) *Attorney, Agent, or Firm* — Muncy, Geissler, Olds & Lowe, P.C.

(57) ABSTRACT

A backlight module of an illuminated keyboard device includes a circuit board and a plurality of light-emitting elements. The circuit board has a top surface and a bottom surface opposite to the top surface. The top surface has a plurality of key assembling regions. Each of the key assembling regions has a stress release hole defined through the top surface and the bottom surface. The light-emitting elements are respectively disposed on the key assembling regions. Each of the light-emitting elements includes a main body and a conductive portion connected to the main body. The conductive portion is electrically connected to the circuit board, and the stress release hole is adjacent to the conductive portion of each of the light-emitting elements.

16 Claims, 7 Drawing Sheets

ILLUMINATED KEYBOARD AND BACKLIGHT MODULE THEREOF

CROSS-REFERENCE TO RELATED APPLICATION

This non-provisional application claims priority under 35 U.S.C. § 119(a) to Patent Application No. 111118768 filed in Taiwan, R.O.C. on May 19, 2022, the entire contents of which are hereby incorporated by reference.

BACKGROUND

Technical Field

The instant disclosure relates to a keyboard, in particular, to an illuminated keyboard and a backlight module thereof.

Related Art

At present, Keyboards are common input device and are generally used with electronic devices such as a desktop computer, a notebook computer, a smartphone or a tablet computer. Moreover, to allow the user to use the keyboard under the environment with insufficient illumination, an illuminated keyboard with the light-emitting function is developed.

SUMMARY

For the illuminated keyboards available in the market, a backlight module known to the inventor is provided as the light-emitting source, the backlight module includes a circuit board and a light-emitting element, and the light-emitting element is soldered on the circuit board for emitting lights for illumination. However, during the manufacture or the use of the backlight module, if the backlight module is subjected to an external force or is suspended (for example, when the user picks the backlight module from a place where the backlight module is placed), the circuit board of the backlight module may be bent and deformed owing the external force or gravity. As a result, the soldered portion of the light-emitting element will be affected by the stress, so that loose contact or connection failure between the soldered portion of the light-emitting element and the circuit board may be caused.

In view of this, in one embodiment, a backlight module of an illuminated keyboard device is provided. The backlight module comprises a circuit board and a plurality of light-emitting elements. The circuit board has a top surface and a bottom surface opposite to the top surface. The top surface has a plurality of key assembling regions. Each of the key assembling regions has a stress release hole defined through the top surface and the bottom surface. The light-emitting elements are respectively disposed on the key assembling regions. Each of the light-emitting elements comprises a main body and a conductive portion connected to the main body. The conductive portion is electrically connected to the circuit board, and the stress release hole is adjacent to the conductive portion of each of the light-emitting elements.

In another embodiment, an illuminated keyboard is provided. The illuminated keyboard comprises the aforementioned backlight module and a plurality of keys. The keys are respectively disposed above the key assembling regions of the circuit board of the backlight module.

Based on the above, in the backlight module according to one or some embodiments of the instant disclosure, each of the key assembling regions of the circuit board has the stress release hole adjacent to the conductive portion of a corresponding one of the light-emitting elements. Therefore, when the circuit board of the backlight module is subjected to an external force and thus deformed, the stress release hole prevents the conductive portion of the light-emitting element from being affected by the deformation of the circuit board, so that loose contact or connection failure between the light-emitting element and the circuit board can be prevented.

BRIEF DESCRIPTION OF THE DRAWINGS

The disclosure will become more fully understood from the detailed description given herein below for illustration only, and thus not limitative of the disclosure, wherein.

DETAILED DESCRIPTION

Embodiments are provided for facilitating the descriptions of the instant disclosure. However, the embodiments are provided as examples for illustrative purpose, but not a limitation to the instant disclosure. In all the figures, the same reference numbers refer to identical or similar elements.

Figure 1:
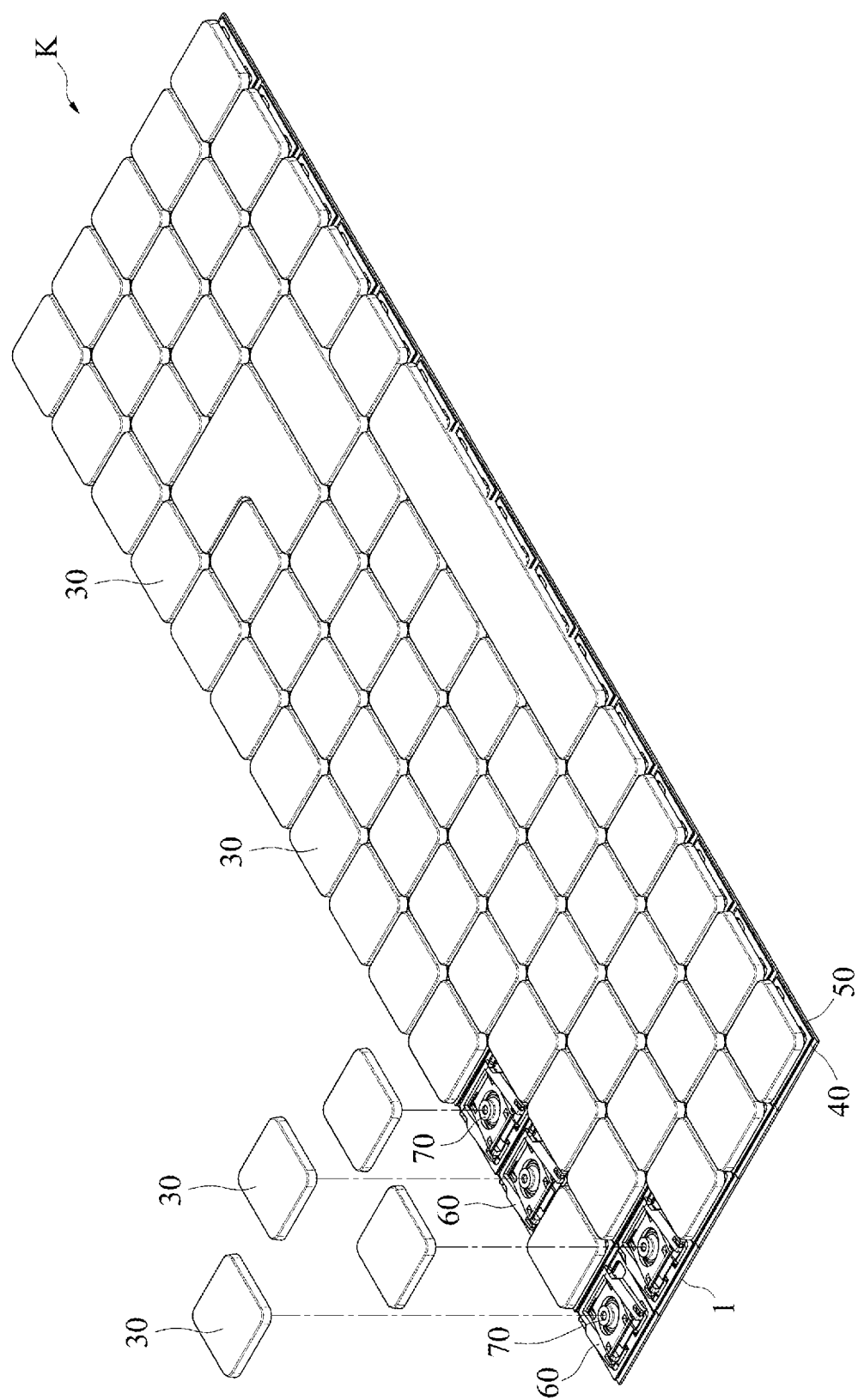
FIG. 1 illustrates an exploded view of an illuminated keyboard according to an exemplary embodiment of the instant disclosure.
Figure 2:
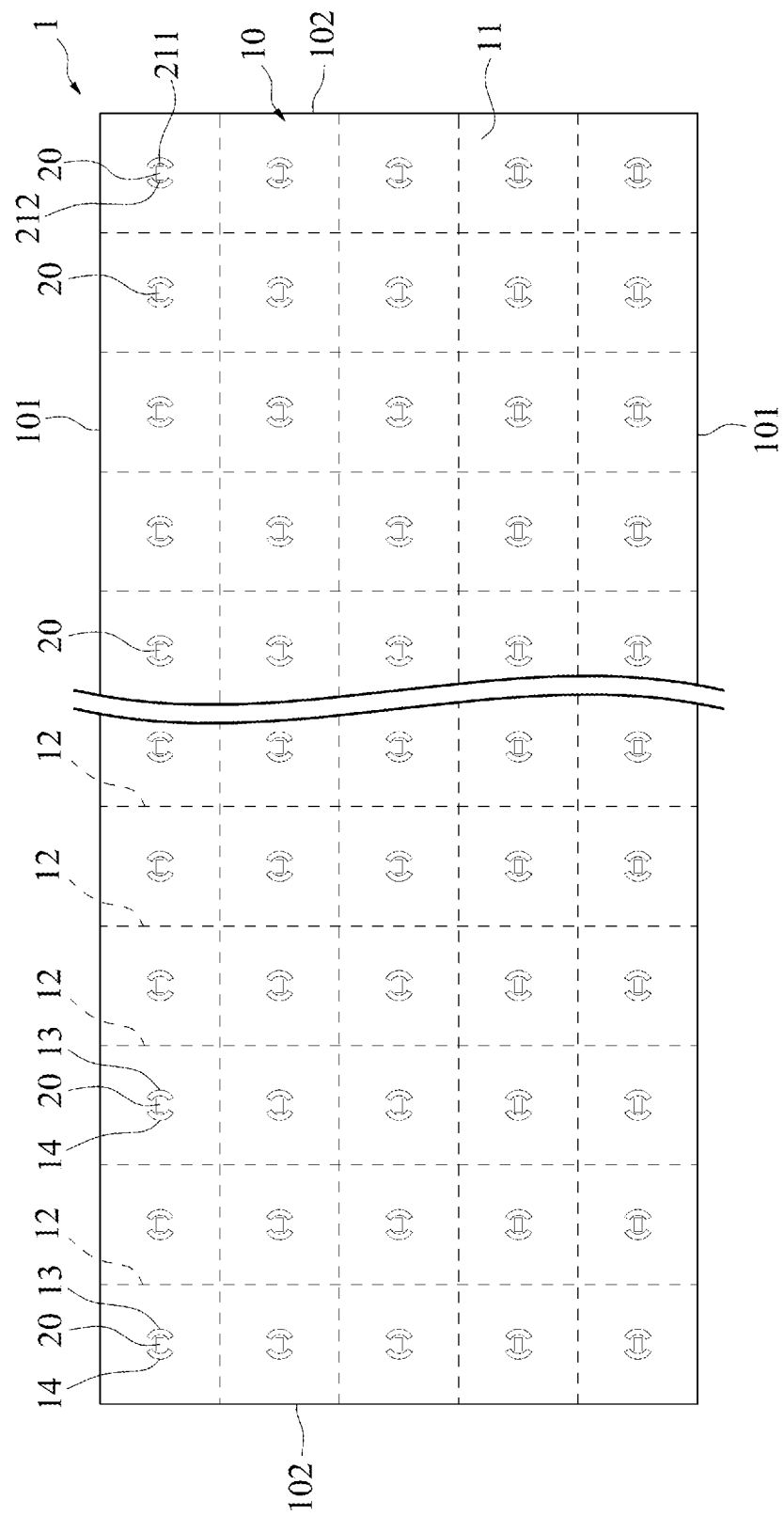
FIG. 2 illustrates a plan view of a backlight module according to an exemplary embodiment of the instant disclosure.
Figure 3:
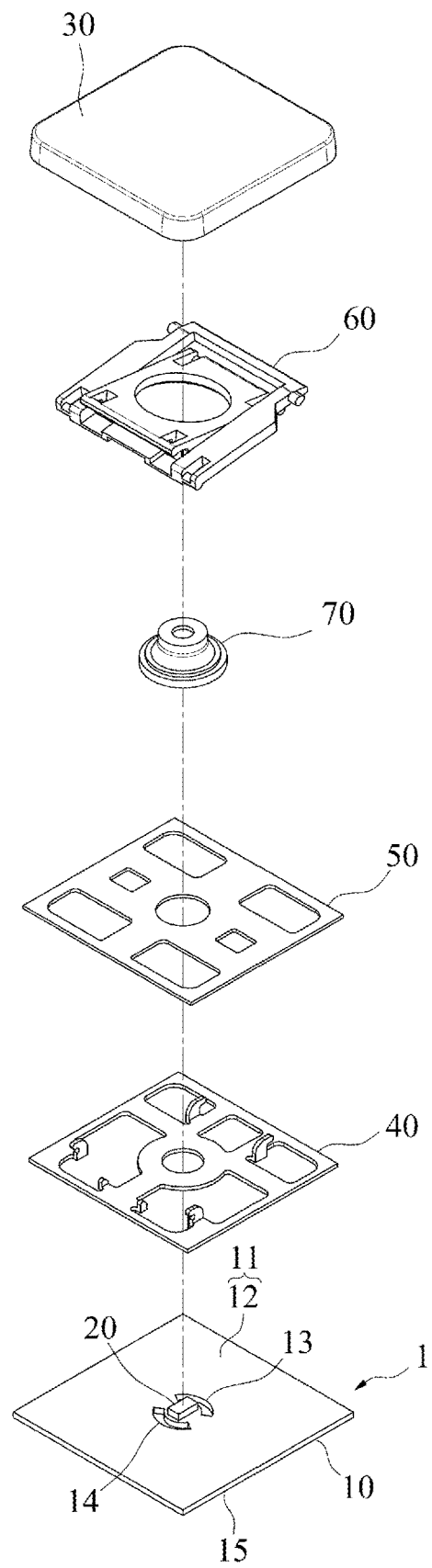
FIG. 3 illustrates an exploded partial view of an illuminated keyboard according to an exemplary embodiment of the instant disclosure.

FIG. 1 illustrates an exploded view of an illuminated keyboard according to an exemplary embodiment of the instant disclosure. FIG. 2 illustrates a plan view of a backlight module according to an exemplary embodiment of the instant disclosure. FIG. 3 illustrates an exploded partial view of an illuminated keyboard according to an exemplary embodiment of the instant disclosure. As shown in FIG. 1 to FIG. 3, the illuminated keyboard K comprises a backlight module 1 and a plurality of keys 30 (for example, the keys 30 may include, the Caps lock key, the Shift key, the Ctrl key, the Enter key, the Backspace key, etc.). The keys 30 are arranged above the backlight module 1, and the backlight module 1 is adapted to emit lights to illuminate the keys 30.

As shown in FIG. 1 to FIG. 3, the backlight module 1 comprises a circuit board and a plurality of light-emitting elements 20. The circuit board 10 has a top surface 11 and a bottom surface 15 opposite to the top surface 11. The top surface 11 has a plurality of key assembling regions 12. The key assembling regions 12 are portions of the top surface 11 of the circuit board 10 (for example, as shown in FIG. 2, the key assembling regions 12 are marked with dotted frames). The keys 30 are disposed above the key assembling regions 12.

As shown in FIG. 1 to FIG. 3, the light-emitting elements 20 are respectively disposed on the key assembling regions 12. In this embodiment, each of the key assembling regions 12 is provided with one light-emitting element 20, but the instant disclosure is not limited thereto; in some embodiments, each of the key assembling regions 12 may be provided with two or more light-emitting elements 20. Accordingly, the lights emitted from the light-emitting elements 20 can be illuminated to the keys 30. For example, the key 30 may have a light-transmissive region (which may be a number region or a text region). When the lights are illuminated to the key 30, the lights can pass through the light-transmissive region of the key 30, so that the illuminated keyboard K can be utilized under an environment with insufficient illuminations.

In some embodiments, the circuit board 10 may be a rigid circuit board (for example, a printed circuit board (PCB)) or a rigid-flex PCB. The light-emitting element may be a light-emitting diode (LED), an incandescent lamp, a halogen lamp, or the like.

As shown in FIG. 1 to FIG. 3, a substrate 40, a keyboard circuit board 50, a plurality of connection members 60, and a plurality of resilient members 70 may be disposed on the backlight module 1. The substrate 40 may be a rigid plate made of metal (e.g., iron, aluminum, and alloy) or plastic material to support components. The keyboard circuit board 50 is stacked above the substrate 40. Each of the connection members 60 is connected between a corresponding one of the key assembling regions 12 and a corresponding one of the keys 30, so that the keys 30 are assembled on the substrate 40. Each of the resilient members 70 is disposed between the keyboard circuit board 50 and a corresponding one of the keys 30. When the key 30 is pressed, the connection member 60 can guide the key 30 to be moved downwardly to abut against the resilient member 70, so that the keyboard circuit board 50 is triggered by the resilient member 70 to generate corresponding signal(s). When the key 30 is released, the elastic force stored in the resilient member 70 allows the key 30 to be moved back to its original position (a position that the key 30 is not pressed).

In some embodiments, the keyboard circuit board 50 may be a printed circuit board (PCB), a membrane circuit board, a flexible print circuit board (FPCB), a rigid-flex PCB, or the like. The connection member 60 may be a scissor-type connection member (as shown in FIG. 1 and FIG. 3), a butterfly-type connection member, a mechanical switch, or the like. The resilient member 70 may be a rubber dome, a metal dome, a spring, an elastic piece, or other elastic members, so that when the resilient member 70 is pressed, the elastic force can be stored in the resilient member 70.

Figure 4:
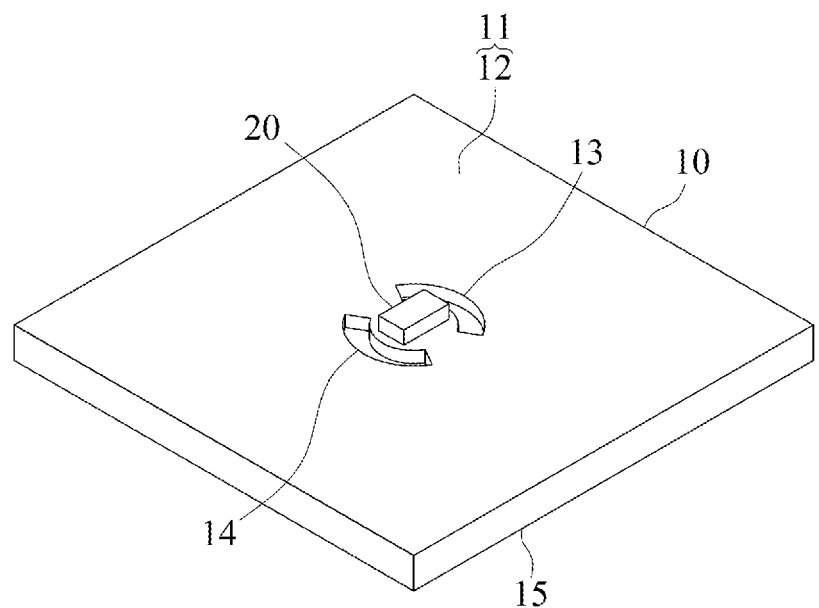
FIG. 4 illustrates a partial perspective view of a backlight module according to an exemplary embodiment of the instant disclosure.
Figure 5:
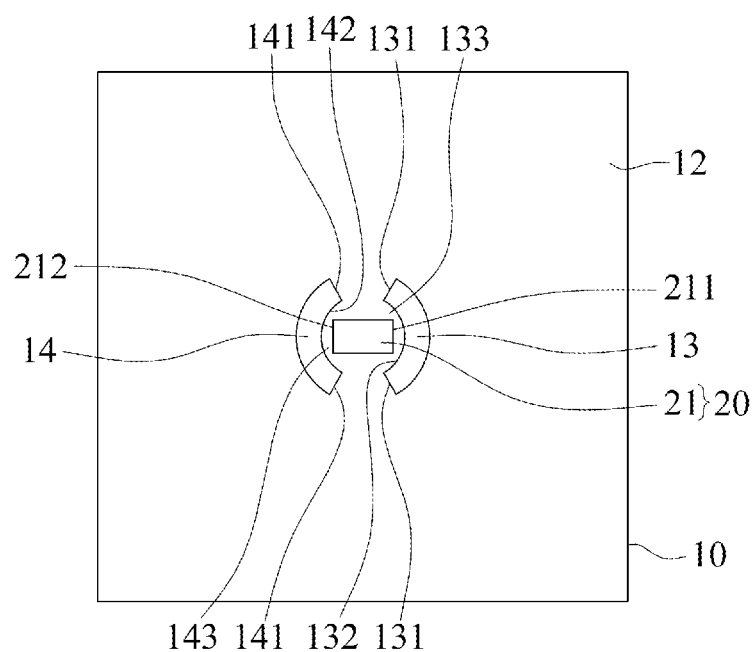
FIG. 5 illustrates a partial plan view of a backlight module according to an exemplary embodiment of the instant disclosure.
Figure 6:
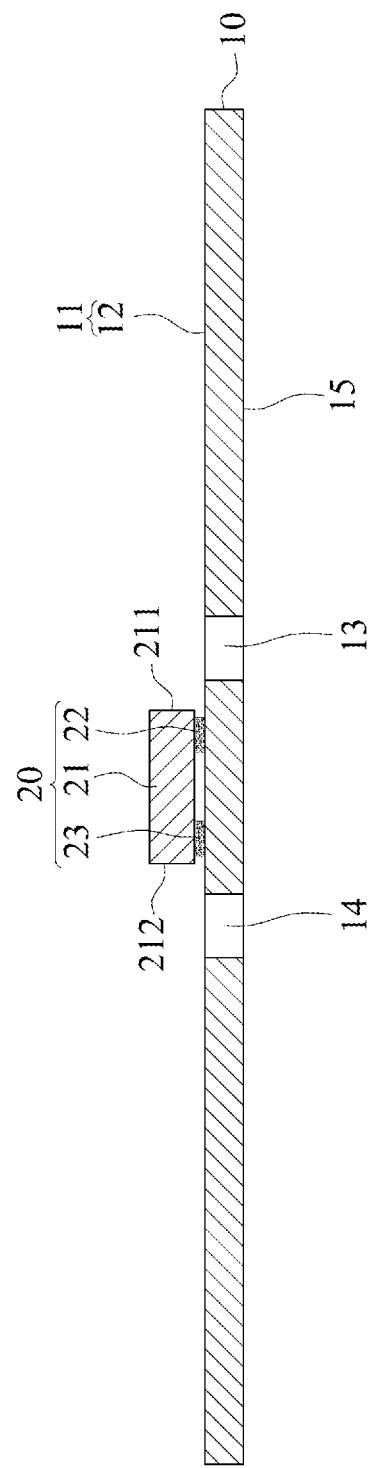
FIG. 6 illustrates a partial cross-sectional view of a backlight module according to an exemplary embodiment of the instant disclosure.

FIG. 4 illustrates a partial perspective view of a backlight module according to an exemplary embodiment of the instant disclosure. FIG. 5 illustrates a partial plan view of a backlight module according to an exemplary embodiment of the instant disclosure. FIG. 6 illustrates a partial cross-sectional view of a backlight module according to an exemplary embodiment of the instant disclosure. As shown in FIG. 4 to FIG. 6, take one of the key assembling regions 12 of the circuit board 10 as an example, the key assembling region 12 has at least one stress release hole. in this embodiment, the key assembling region 12 has two stress release holes (a first stress release hole 13 and a second stress release hole 14), the first stress release hole 13 is defined through the top surface 11 and the bottom surface of the circuit board 10, and the second stress release hole 14 is defined through the top surface 11 and the bottom surface 15 of the circuit board 10. However, the number of the stress release hole is not limited thereto; for example, the number of the stress release hole may be one or may be three or more.

As shown in FIG. 4 to FIG. 6, the light-emitting element 20 on the key assembling region 12 comprises a main body 21 and at least one conductive portion connected to the main body 21. In this embodiment, the light-emitting element 20 comprises two conductive portions (a first conductive portion 22 and a second conductive portion 23), and the first conductive portion 22 and the second conductive portion 23 are respectively connected to two opposite sides of a bottom portion of the main body 21 so as to be electrically connected to the circuit board 10. However, the number of the conductive portion is not limited thereto; for example, the number of the conductive portion may be one or may be three or more.

In some embodiments, the first conductive portion 22 and the second conductive portion 23 are respectively the positive conductive portion and the negative conductive portion of the light-emitting element 20. For example, the first conductive portion 22 and the second conductive portion 23 may be positive and negative conductive terminals (such as conductive sheets or conductive wires) made of conductive material(s) (such as metal), and the first conductive portion 22 and the second conductive portion 23 are electrically connected to the circuit board by soldering.

Further, as shown in FIG. 4 to FIG. 6, the first stress release hole 13 and the second stress release hole 14 are at two opposite sides of the main body 21 of the light-emitting element 20. In other words, in this embodiment, the light-emitting element is between the first stress release hole 13 and the second stress release hole 14, and the first stress release hole 13 and the second stress release hole 14 are respectively adjacent to the first conductive portion 22 and the second conductive portion 23.

Figure 8:
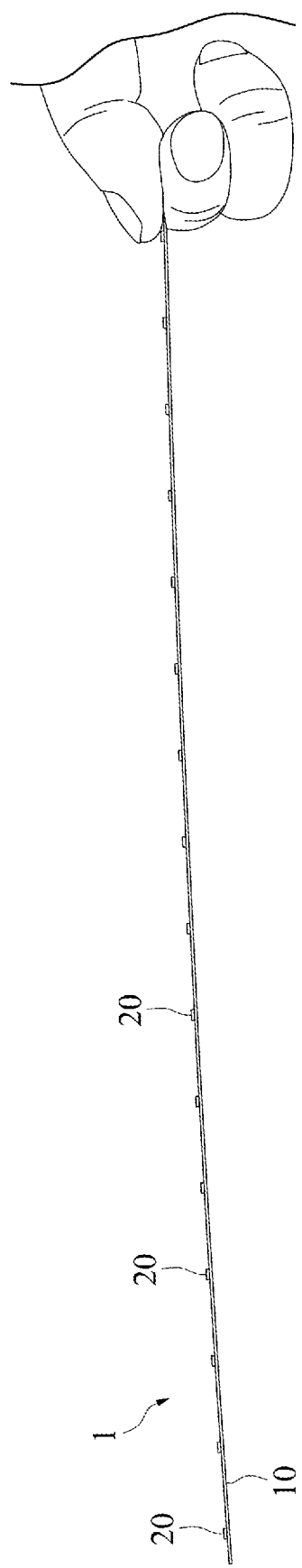
FIG. 8 illustrates a schematic view showing the operation of a backlight module according to an exemplary embodiment of the instant disclosure.

Based on the above, according to one or some embodiments of the instant disclosure, each of the key assembling regions 12 of the circuit board 10 of the backlight module 1 has the stress release hole (such as the first stress release hole 13 and the second stress release hole 14) adjacent to the conductive portion (such as the first conductive portion 22 and the second conductive portion 23) of a corresponding one of the light-emitting elements 20. Therefore, when the circuit board 10 of the backlight module 1 is subjected to an external force and deformed, the stress release hole prevents the conductive portion of the light-emitting element 20 from being affected by the deformation of the circuit board 10, so that loose contact or connection failure between the light-emitting element 20 and the circuit board 10 can be prevented. For example, as shown in FIG. 8, during manufacturing or using the backlight module 1, if the backlight module 1 is moved and suspended (in this illustrative case, when the user holds one side of the backlight module 1 to move the backlight module 1), the circuit board 10 of the backlight module 1 will be bent and deformed owing to the gravity. The stress release hole on the key assembling region 12 can be prevent the deformation of the circuit board from affecting the portion of the circuit board 10 on which the light-emitting element is disposed. Therefore, the portion of the circuit board 10 on which the light-emitting element 20 is disposed can be kept flat and does not deform upon some other portions of the circuit board 10 are deformed, or the deformation extent of the portion of the circuit board 10 on which the light-emitting element 20 is disposed can be reduced greatly. Hence, the stress release hole can prevents the conductive portion of the light-emitting element 20 from being affected by the deformation of the circuit board 10, so that loose contact or connection failure between the light-emitting element 20 and the circuit board can be prevented.

As shown in FIG. 4 to FIG. 6, in this embodiment, the main body 21 of the light-emitting element 20 is rectangular-shaped and has a first short side 211 and a second short side 212 opposite to the first short side 211. The first conductive portion 22 and the second conductive portion 23 are respectively adjacent to the first short side 211 and the second short side 212. The length of the first stress release hole 13 is greater than the length of the first short side 211, and the length of the second stress release hole 14 is greater than the length of the second short side 212, so that the edge of the light-emitting element 20 does not protrude out of the edge portion of the first stress release hole 13 and the edge portion of the second stress release hole 14. Therefore, it can be ensured that the entire light-emitting element 20 is between the first stress release hole 13 and the second stress release hole 14. Hence, the conductive portion of each of the light-emitting elements 20 can be prevented from being affected by the stress generated by the deformation of the circuit board 10 more effectively.

As shown in FIG. 4 to FIG. 6, in this embodiment, both the first stress release hole 13 and the second stress release hole 14 are curved-shaped. The first stress release hole 13 has two first end portions 131 and a first inner curved edge 132, the two first end portions 131 and the first inner curved edge 132 are enclosed to form a first bow-shaped region 133, and the first short side 211 of the main body 21 of the light-emitting element is in the first bow-shaped region 133. Likewise, the second stress release hole 14 has two second end portions 141 and a second inner curved edge 142, the two second end portions 141 and the second inner curved edge 142 are enclosed to form a second bow-shaped region 143, and the second short side 212 of the main body 21 of the light-emitting element 20 is in the second bow-shaped region 143. Therefore, in this embodiment, the entire light-emitting element 20 is surrounded by the first stress release hole 13 and the second stress release hole 14. Hence, the conductive portion of each of the light-emitting elements 20 can be prevented from being affected by the stress generated by the deformation of the circuit board 10 more effectively.

In some embodiments, the first stress release hole 13 and the second stress release hole 14 may be of other shapes (for example, square, rectangular, trapezoidal, elliptical, or other irregular shapes).

Figure 7:
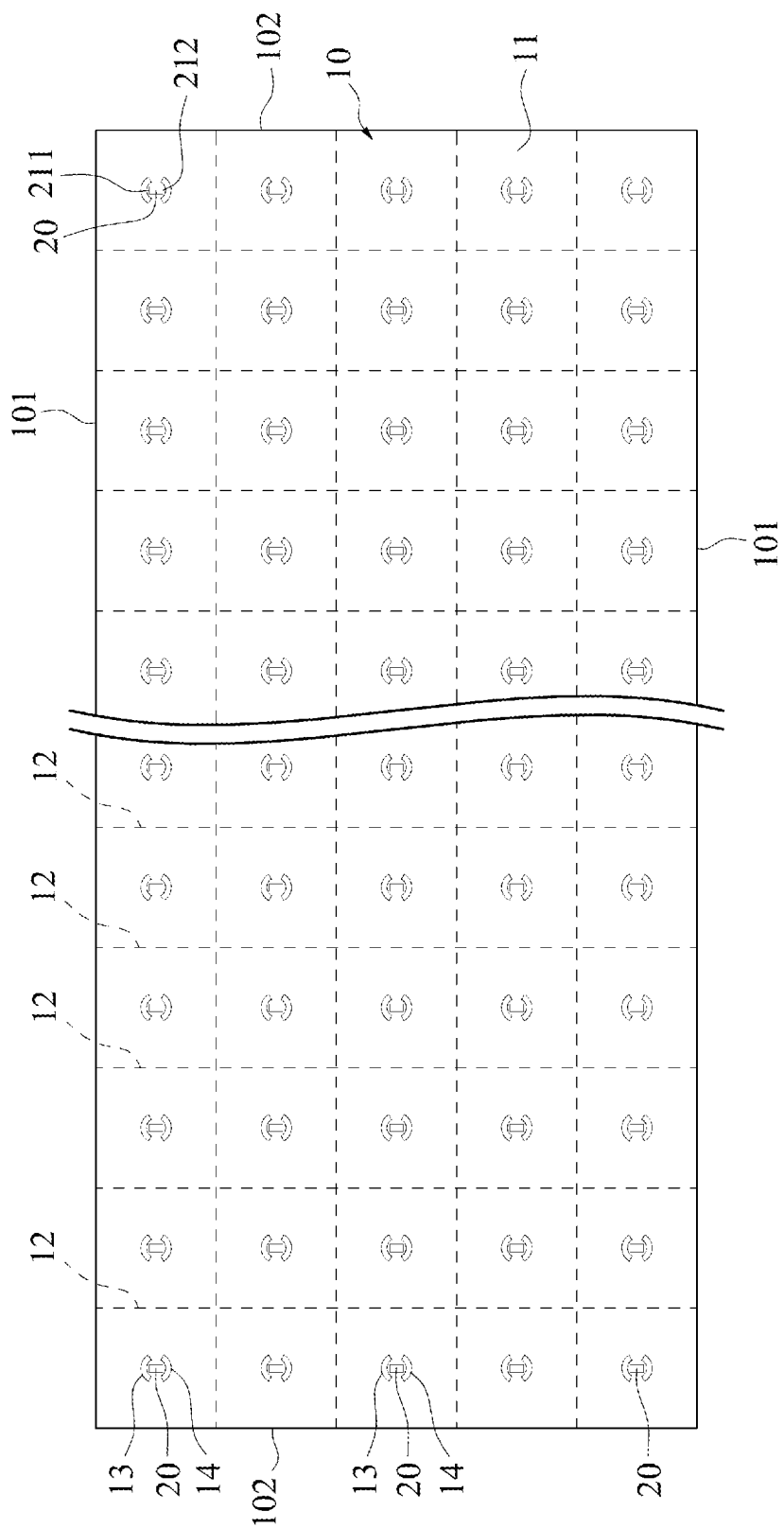
FIG. 7 illustrates a plan view of a backlight module according to another exemplary embodiment of the instant disclosure.

Please refer to FIG. 2 and FIG. 5. In this embodiment, the circuit board 10 is rectangular-shaped and has two opposite long sides 101 and two opposite short sides 102. The first short side 211 and the second short side 212 of each of the light-emitting elements 20 are respectively perpendicular to the two long sides 101 of the circuit board. Alternatively, as shown in FIG. 7, which illustrates a plan view of a backlight module according to another exemplary embodiment of the instant disclosure. In this embodiment, the first short side 211 and the second short side 212 of each of the light-emitting elements 20 are respectively parallel to the two long sides 101 of the circuit board 10. Accordingly, in this embodiment, when the circuit board 10 is subjected to an external force, the deformation extent of the circuit board 10 along the direction of the long side 101 is generally greater than the deformation extent of the circuit board 10 along the direction of the short side 102. Therefore, by configuring the first short side 211 and the second short side 212 of each of the light-emitting elements 20 which are less prone to be deformed to be parallel to the long side 101 of the circuit board 10, the conductive portion of each of the light-emitting elements 20 can be prevented from being affected by the stress generated by the deformation of the circuit board 10 more effectively.

Based on the above, in the backlight module according to one or some embodiments of the instant disclosure, each of the key assembling regions of the circuit board has the stress release hole adjacent to the conductive portion of a corresponding one of the light-emitting elements. Therefore, when the circuit board of the backlight module is subjected to an external force and deformed, the stress release hole prevents the conductive portion of the light-emitting element from being affected by the deformation of the circuit board, so that loose contact or connection failure between the light-emitting element and the circuit board can be prevented.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A backlight module of an illuminated keyboard comprising:
    a circuit board having a top surface and a bottom surface opposite to the top surface, wherein the top surface has a plurality of key assembling regions, each of the key assembling regions has at least one stress release hole, and the at least one stress release hole is defined through the top surface and the bottom surface; and
    a plurality of light-emitting elements respectively disposed on the key assembling regions, wherein each of the light-emitting elements comprises a main body and at least one conductive portion connected to the main body, the at least one conductive portion is electrically connected to the circuit board, and the at least one stress release hole is adjacent to the at least one conductive portion of each of the light-emitting elements,
    wherein the at least one conductive portion comprises a first conductive portion and a second conductive portion, and the first conductive portion and the second conductive portion are respectively connected to two opposite sides of the main body; the at least one stress release hole comprises a first stress release hole and a second stress release hole, the first stress release hole and the second stress release hole are respectively at the two opposite sides of the main body, and the first stress release hole and the second stress release hole are respectively adjacent to the first conductive portion and the second conductive portion.

2. The backlight module according to claim 1, wherein the main body is rectangular-shaped and has a first short side and a second short side opposite to the first short side, and the first conductive portion and the second conductive portion are respectively adjacent to the first short side and the second short side.

3. The backlight module according to claim 2, wherein a length of the first stress release hole is greater than a length of the first short side.

4. The backlight module according to claim 2, wherein the first stress release hole has two first end portions and a first inner curved edge, the two first end portions and the first inner curved edge are enclosed to form a first bow-shaped region, and the first short side is in the first bow-shaped region.

5. The backlight module according to claim 4, wherein the second stress release hole has two second end portions and a second inner curved edge, the two second end portions are the second inner curved edge are enclosed to form a second bow-shaped region, and the second short side is in the second bow-shaped region.

6. The backlight module according to claim 2, wherein the circuit board is rectangular-shaped and has two long sides opposite to each other, and the first short side of each of the light-emitting elements is parallel to each of the two long sides.

7. The backlight module according to claim 2, wherein the circuit board is rectangular-shaped and has two long sides opposite to each other, and the first short side of each of the light-emitting elements is perpendicular to each of the two long sides.

8. The backlight module according to claim 1, wherein the first stress release hole is curve-shaped.

9. An illuminated keyboard comprising:
the backlight module according to claim 1; and
a plurality of keys respectively disposed above the key assembling regions of the circuit board of the backlight module.

10. The illuminated keyboard according to claim 9, wherein the first stress release hole is curve-shaped.

11. The illuminated keyboard according to claim 9, wherein the main body is rectangular-shaped and has a first short side and a second short side opposite to the first short side, and the first conductive portion and the second conductive portion are respectively adjacent to the first short side and the second short side.

12. The illuminated keyboard according to claim 11, wherein a length of the first stress release hole is greater than a length of the first short side.

13. The illuminated keyboard according to claim 11, wherein the first stress release hole has two first end portions and a first inner curved edge, the two first end portions and the first inner curved edge are enclosed to form a first bow-shaped region, and the first short side is in the first bow-shaped region.

14. The illuminated keyboard according to claim 13, wherein the second stress release hole has two second end portions and a second inner curved edge, the two second end portions are the second inner curved edge are enclosed to form a second bow-shaped region, and the second short side is in the second bow-shaped region.

15. The illuminated keyboard according to claim 11, wherein the circuit board is rectangular-shaped and has two long sides opposite to each other, and the first short side of each of the light-emitting elements is parallel to each of the two long sides.

16. The illuminated keyboard according to claim 11, wherein the circuit board is rectangular-shaped and has two long sides opposite to each other, and the first short side of each of the light-emitting elements is perpendicular to each of the two long sides.

* * * * *